United States Patent [19]

Frohmader et al.

[11] 4,010,047

[45] Mar. 1, 1977

[54] METHOD FOR STABILIZING A SUPERCONDUCTOR

[75] Inventors: Sigrun Frohmader; Günther Ziegler, both of Erlangen, Germany

[73] Assignee: Siemens Aktiengesellschaft, Munich, Germany

[22] Filed: Apr. 30, 1975

[21] Appl. No.: 573,075

[30] Foreign Application Priority Data

May 16, 1974 Germany .................... 2423712

[52] U.S. Cl. .................... 148/20.3; 148/127; 148/133

[51] Int. Cl.² .................... C21D 1/56; C21D 1/00

[58] Field of Search ............... 148/133, 127, 31.5, 148/20.3, 175, 11.5; 29/599, 194, 199; 75/134 Y, 174

[56] References Cited

UNITED STATES PATENTS

| | | | |
|---|---|---|---|
| 3,145,125 | 8/1964 | Lyons | 148/175 |
| 3,523,822 | 8/1970 | Freeman | 148/133 |
| 3,728,165 | 4/1973 | Howlett | 148/127 |
| 3,829,963 | 8/1974 | McDougall et al. | 29/599 |
| 3,836,404 | 9/1974 | Strauss | 148/11.5 R |
| 3,887,364 | 6/1975 | Kawabe et al. | 148/133 |

*Primary Examiner*—Walter R. Satterfield
*Attorney, Agent, or Firm*—Kenyon & Kenyon Reilly Carr & Chapin

[57] ABSTRACT

A method for stabilizing a superconductor of the type having at least one core which is entirely or partly of an intermetallic superconductive compound and which is provided with a sheath of an alloy which contains an electrically normal-conducting metal and an element of the compound, in which the element of the compound contained in the sheath is removed from the sheath, at least partially, by a chemical transport reaction to obtain electrical stabilization of the superconductor.

13 Claims, 1 Drawing Figure

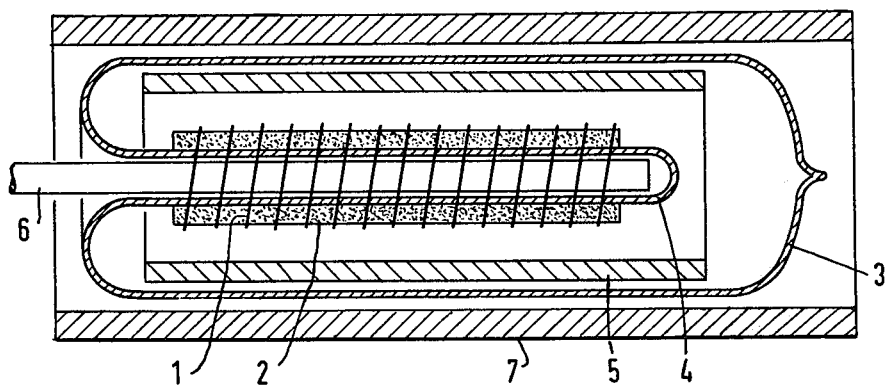

METHOD FOR STABILIZING A SUPERCONDUCTOR

SPECIFICATION

The invention concerns a method for stabilizing a superconductor of the type having at least one core consisting entirely or partly of an intermetallic superconductive compound and which is provided with a sheath of an alloy which contains an electrically normal conducting metal and an element of the compound in general and more particularly to a method of improving stabilization in such a superconductor.

Superconductive intermetallic compounds of the type $A_3B$, consisting of two elements, for example, $Nb_3Sn$ or $V_3Ga$, which have an A–15 crystal structure exhibit very good superconductor properties being particularly distinguished by a high critical magnetic field, a high transition temperature and a high critical current density. As a result, they are particularly well suited as superconductors for superconducting coils used to generate strong magnetic fields such as are needed for research purposes. Other possible applications include superconducting magnets for the suspension guidance of magnetic suspension railroads and the windows of electric machines. Recently, ternary compounds such as niobiumaluminum-germanium ($Nb_3Al_{0.8}Ge_{0.2}$) have also become of special interest. However, since these compounds are very brittle, their manufacture in a form suitable, for example, for use in magnet coils presents considerable difficulties. Several methods of manufacturing superconductors in the form of long wires or ribbons with, in particular, two-component intermetallic compounds have been disclosed. These methods are used particularly for the manufacture of what are known as multi-core conductors. Such conductors have wires, typically of $Nb_3Sn$ or $V_3Ga$, arranged in a normal conducting matrix. In the known methods, a ductile element, in wire form, of the compound to be prepared, e.g., a niobium or vanadium wire, is surrounded with a sleeve of an alloy containing a ductile carrier metal and the remaining elements of the compound, e.g., a copper-tin alloy or a copper-gallium alloy. In particular, a multiplicity of such wires are embedded in a matrix of the alloy. The structure so obtained is then subjected to cross-section reducing processing to obtain a long wire such as is required for coils. As a result the diameter of the wires, e.g., niobium or vanadium wire, for example, is reduced to a small value in the order of magnitude of about 30 to 50 $\mu$m or even less, which is desirable in view of the superconduction properties of the conductor. Through the cross-section reducing processing attempts are also made to obtain the best possible metallurgical bond between the wire and the surrounding matrix material of the alloy without, however, the occurrence of reactions which lead to embrittlement of the conductor. After the cross-section reducing processing, the conductor, consisting of one or more wires and the surrounding matrix material, is subjected to a heat treatment such that the desired compound is formed by a reaction of the wire material, i.e., the niobium or vanadium, for instance, with the further element, contained in the surrounding matrix, of the compound, e.g., tin or gallium. In this process, the element contained in the matrix diffuses into the wire material, which consists of the other element of the compound, and reacts therewith forming a layer consisting of the desired compound. (See United Kingdom patent spec. No. 1,280,583 and 1,335,447; U.S. Pat. No. 3,728,165.)

A particular difficulty with the known methods is that the matrix material containing the embedded cores, consisting of the carrier metal and the remaining elements of the compound to be produced, is relatively difficult to deform, particularly for higher concentrations of these elements.

Proposed methods are also known which overcome this problem. In these methods one or more cores of a ductile element of the compound to be produced, particularly niobium or vanadium, are embedded in a ductile matrix material, e.g., copper, silver or nickel, which contains, at most, only very small amounts of the element of the compound to be produced. The structural consisting of the cores and this matrix material can then be processed without any intermediate anneal by a cross-section reducing process, e.g., by cold-drawing, into a thin wire which contains very thin cores of vanadium or niobium. After the last cross-section reducing process step, the remaining elements of the compound to be produced, e.g., tin in the case of $Nb_3Sn$, are then applied to the matrix material. This is done by briefly immersing the wire in a tin melt, so that a thin tin layer is formed on the matrix material, or by evaporating a tin layer on the matrix material. Subsequently, a heat treatment is performed, in which the elements of the compound to be produced, which have been applied to the matrix material, are first diffused into the matrix material and then through it, and then form the desired superconductive compound through reaction with the cores (see "Applied Physics Letters" vol. 20 (1972); pages 443 to 445; U.S. Pat. No. 3,829,963.

However, in all these methods the cores of the superconductive intermetallic compound are surrounded by a matrix material which generally consists of an alloy of an electrically highly normal conducting metal, such as copper, with an element of the intermetallic compound, e.g., gallium or tin in the finished conductor. Such alloys, of course, have both poorer electric conductivity and poorer thermal conductivity than, for instance, pure copper. This has an adverse effect on the electrical stabilization of the conductors. For good electrical stabilization it is desirable that the superconducting cores have an envelope of metal with an electric and thermal conductivity which is as high as possible so that it can carry the current flowing through conductor in the event of a transition of the superconducting cores to the normal conducting state if necessary and can transfer heat produced in the conductor, due to jumps in the magnetic flux or, in the event of a transition into the normal conducting state, due to ohmic looses, to the coolant surrounding the conductor.

To improve the stabilization, it is therefore desirable to replace the poorly conducting alloy matrix of the superconductors with a matrix or envelope of a metal which is as pure as possible and which as high electric and thermal conductivity. In a method known from the U.S. Pat. No. 3,829,963 this is accomplished by at least partially removing the copper-tin matrix from the $Nb_3Sn$ cores in an $Nb_3Sn$ multi-core conductor, after the heat treatment for generating the $Nb_3Sn$ layers, using a chemical reaction or electrolytic anodic dissolution. Subsequently, the cores are provided with a copper matrix by conducting them through a bath of molten copper which is kept at a temperature of 1100° C in an inert atmosphere.

Such a method, however, is extremely expensive and requires great care in the control of the process both in order not to damage the $Nb_3Sn$ cores when dissolving the matrix, and to obtain reproducible results.

SUMMARY OF THE INVENTION

It is an object of the present invention to stabilize a superconductor with at least one core which consists entirely or partly of an intermetallic cuperconductive compound and is provided with a sheath of an alloy containing an electrically highly normal conducting metal and one element of the compound in a considerably simpler manner.

According to the present invention this is accomplished by at least partially removing from the sheath the element of the compound contained therein using a chemical transport reaction.

Chemical transport reactions themselves are known and are characterized by the feature that a solid or liquid substance reacts with gases, forming only gaseous reaction products, and that subsequently, at other points of the system, a reverse reaction takes place, the starting substance being precipitated. A condition for a chemical transport reaction is, besides the reversibility of the chemical reaction that takes place, the presence of a concentration gradient between the point at which the gaseous reaction products are formed and the point at which the gaseous reaction products are formed and the point where the reverse reaction products are formed and the point where the reverse reaction through decomposition of these reaction products is to take place (see H. Schaefer, "Chemical transport reactions," Weinheim/Bergstr., Verlag Chemie, 1962, page 11).

As compared to known methods, a large number of advantages are obtained through the use of chemical transport reactions for removing thereform, with the present method the element of the compound contained in the sheath. First, it has been found the chemical transport reactions can be carried out at temperatures which are considerably below the melting point of copper. In addition the separation of the matrix from the cores and, thus, destruction of the good metallurgical contact of the cores with the matrix material which was established during the cross-sectional-reducing processing is avoided. Also, the element contained in the sheath can be removed by means of chemical transport reactions with good reproducibility, so that the electric conductivity of the sheath can be easily adjusted by appropriate control of the reaction.

Basically, for carrying out the method the superconductor to be treated along with a transport agent need only be placed in an evacuated or a protective gas filled reaction vessel and the vessel then heated to get the chemical transport reaction. Even if the conductor and the wall of the vessel are at the same temperature, the element to be removed of the compound will still be transported from the conductor sheath to the wall of the reaction vessel, where it then precipitates as a metallic mirror. Such a transport of matter without a temperature gradient suprisingly has been found possible since even at an even temperature different reaction equilibria evidently adjust themselves in the two corresponding transport reactions occuring at the alloy forming the source for the element to be transported and at the wall of the vessel.

It is particularly advantageous, however, to not precipitate the element to be removed at the wall of the vessel, but to provide a suitable getter in the vicinity of the superconductor to be treated for the element to be removed. Preferably, the getter will consist of the electrically highly normal conducting metal which is also contained in the alloy. The getter advantageously will concentrically surround the conductor.

It is further advisable to establish a temperature gradient between the conductor and the getter to accelerate the transport reaction. As a rule, the conductor is kept at a higher temperature, and the getter at a lower temperature.

For stabilizing a conductor with at least one core which consists entirely or partly of $Nb_3Sn$ and is surrounded by a copper-tin alloy, it has been found particularly advantageous to subject the conductor to an annealing treatment in an hydrogen chloride gas atmosphere in the presence of a copper getter, since chlorine or hydrogen chloride is a particularly good transport agent for tin. The conductor will advantageously be kept in the temperature range of 700° to 800° C, with the temperature of the getter about 10° to 40° C lower than the temperature of the conductor.

For stabilizing a conductor with at least one core which consists entirely or partly of $V_3Ga$ and is surrounded by a copper-gallium alloy, the process is similar. Preferably, iodine rather than chlorine will be used since iodine is particularly well suited as a transport agent for gallium.

BRIEF DESCRIPTION OF THE DRAWING

The single FIGURE schematically illustrates an apparatus for carrying out the method of the present invention.

DETAILED DESCRIPTION OF THE PREFERRED EMBODIMENTS

EXAMPLE 1

A piece of about 15 cm long of a ribbon shaped conductor, 440 um wide and 100 um thick, with 220 cores of $Nb_3Sn$ embedded in a copper-tin matrix was subjected to a chemical transport reaction to lower the tin content of the matrix. For this purpose, the conductor section was placed in a quartz ampoule about 12 cm long with an inside diameter of about 30 mm. A copper wire approximately 10 cm long and with a diameter of about 500 um was also placed in the ampoule for use as the getter material. Thereupon the ampoule was evacuated down to a residual gas pressure of $10^{-6}$ Torr, was then filled with hydrogen chloride gas with a pressure of 0.05 torr at room temperature, and was sealed. The ampoule was then heated for 48 hours with the ribbon shaped conductor held at a temperature of about 750° C and the copper wire serving as the getter material at a temperature of about 730° C. Subsequently, the ampoule was cooled down and opened.

A metallographic examination of samples of the treated conductor before and after the removal of the tin from the matrix by the chemical transport reaction showed a distinct color difference in the two samples. Prior to the transport reaction the wire sample was yellow, i.e., the color of bronze, and after the transport reaction, definitely copper colored. Measurement of the residual resistance of samples before and after the transport reaction showed a value of $1.5 \times 10^{-5}$ ohm cm before and a value of $1.5 \times 10^{-6}$ ohm cm after, i.e., a reduction by a factor 10 of the residual resistance because of the chemical transport reaction. The tin concentrations in the alloy matrix of the conductor, which were determined by microprobe measurement, were about 6.3 atom percent of tin before the transport reaction and about 0.3 atom percent of tin after the transport reaction.

Thus, the method according to the present invention is extremely well suited for removing the tin from the copper tin matrix of a finished conductor with diffused $Nb_3Sn$ cores and producing a low resistance copper matrix.

EXAMPLE 2

The apparatus shown in the figure is particularly well suited for treating longer wires using the method of the present invention. The superconductor 1 to be treated, e.g., an $Nb_3Sn$ multi-core conductor with a copper-tin matrix, is first wound on a ceramic tube 2. The tube 2 is placed in a quartz ampoule 3 and pushed on a re-entrant part 4 provided in the ampoule. A copper tube 5 is inserted into the ampoule for use as the getter in such a manner that it concentrically surrounds the ceramic tube 2 wound with the wire 1. The ampoule is evacuated down to about $10^{-6}$ Torr and filled with hydrogen chloride gas to a pressure of 0.05 Torr. The superconducting wire 1 is then heated to a temperature of about 750° C, with a heater finger 6 placed in the re-entering part 4 and the tubular getter 5 heated with a tube furnace 7 to a temperature of about 740° C. As the surface of the tin rich matrix of the wire 1 the equilibrium of the transport reaction is shifted toward the formation of tin chloride, and at the tin poor surface of the getter 5, it is shifted toward the liberation of tin, i.e., tin is transported from the wire 1 to the getter 5 by the chemical transport reaction.

The method according to the present invention can be applied to all superconductors with superconductive intermetallic compounds regardless of their specific preparation, as long as they have a sheath of an alloy of an electrically highly conductive metal and a chemical, transportable element. These and other modification may be made without departing from the spirit of the invention which is intended to be limited solely by the appended claims.

What is claimed is:

1. A method for stabilizing a superconductor having at least one core which consists at least partially of an intermetallic superconductive compound of the type $A_3B$ consisting of at least two elements and which is provided with a sheath of an alloy containing an electrically highly normal conducting metal and one element of the compound comprising:
  a. disposing the superconductor and a gaseous transport agent within a vessel containing no other active gases;
  b. heating said vessel to the point where a chemical transport reaction takes place in which the element of the compound in the sheath reacts with the transport agent to form a gaseous reaction product, and where at another point within the vessel a reverse reaction takes place depositing the element of another surface therein.

2. The method according to claim 1 and further including the step of placing a getter consisting of the electrically highly normal conducting metal in the vicinity of the superconductor during the chemical transport reaction.

3. The method according to claim 2 and further including the step of establishing a temperature gradient between the superconductor and the getter.

4. The method according to claim 3, wherein the superconductor is kept at a higher temperature than the getter.

5. The method according to claim 2, wherein a tubular getter is placed concentrically about said superconductor.

6. The method according to claim 5 and further including the step of establishing a temperature gradient between the superconductor and the getter.

7. The method according to claim 6, wherein the superconductor is kept at a higher temperature than the getter.

8. The method according to the claim 7 wherein said superconductor core consists at least partially of $Nb_3Sn$ and said sheath of a copper-tin alloy and wherein said chemical transport reaction is carried out by subjecting the conductor to an annealing treatment in a hydrogen chloride gas atmosphere in the presence of a copper getter.

9. The method according to claim 8, wherein the superconductor and the getter are maintained at a temperature in the range of 700° to 800° C with the temperature of the getter maintained approximately between 10° and 40° C lower than the temperature of the conductor.

10. The method according to the claim 1 wherein said superconductor core consists at least partially of $Nb_3Sn$ and said sheath of a copper-tin alloy and wherein said chemical transport reaction is carried out by subjecting the conductor to an annealing treatment in a hydrogen chloride gas atmosphere in the presence of a copper getter.

11. The method according to claim 8, wherein the superconductor and the getter are maintained at a temperature in the range of 700° to 800° C with the temperature of the getter maintained approximately between 10° and 40° C lower than the temperature of the conductor.

12. A method for stabilizing a superconductor having at least one core which consists at least partially of an intermetallic superconductive compound selected from the group consisting of $Nb_3Sn$ and $V_3Ga$ which is provided with a sheath of an alloy containing copper and one element of the compound comprising:
  a. disposing said superconductor and a gaseous transport agent selected from the group consisting of hydrogen chloride, chlorine, iodine and hydrogen iodide in a nonreactive atmosphere;
  b. disposing a getter of copper in the vicinity of said superconductor;
  c. heating said superconductor to a temperature approximately between 700° and 800° C; and
  d. maintaining the temperature of said getter about 10° to 40° C lower than the temperature of said superconductor, whereby a chemical transport reaction will take place with the transport agent reacting with the element in said sheath and transporting and depositing the element through a reverse reaction on said getter.

13. A method for stabilizing a superconductor having at least one core which consists at least partially of an intermetallic superconductive compound of the type $A_3B$ consisting of at least two elements and which is provided with a sheath of an alloy containing an electrically highly normal conducting metal selected from the group consisting of copper, silver, aluminum and gold and one element of the compound comprising:
a. disposing the superconductor and a gaseous transport agent selected from the group consisting of halogens and hydrogen halides within a vessel containing no other active gases;
b. disposing a getter of a metal selected from the group consisting of copper, silver, aluminum and gold in the vicinity of said superconductor;
c. heating said superconductor to a temperature at which a chemical transport reaction takes place in which the element of the compound in the sheath reacts with the transport agent to form a gaseous reaction product; and
d. maintaining the temperature of said getter about 10°–40° C lower than the temperature of said superconductor whereby said chemical transport reaction will cause said element to be deposited on said getter through a reverse reaction.

* * * * *